US010892259B2

(12) United States Patent
Smith

(10) Patent No.: US 10,892,259 B2
(45) Date of Patent: Jan. 12, 2021

(54) APPARATUS CONTAINING CIRCUIT-PROTECTION DEVICES

(71) Applicant: MICRON TECHNOLOGY, INC., Boise, ID (US)

(72) Inventor: Michael Smith, Boise, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/866,723

(22) Filed: May 5, 2020

(65) Prior Publication Data

US 2020/0266189 A1 Aug. 20, 2020

Related U.S. Application Data

(63) Continuation of application No. 16/108,413, filed on Aug. 22, 2018, now Pat. No. 10,679,982, which is a continuation of application No. 15/687,732, filed on Aug. 28, 2017, now Pat. No. 10,163,893.

(51) Int. Cl.
H01L 27/02 (2006.01)
G11C 16/04 (2006.01)
G11C 16/16 (2006.01)
G11C 16/22 (2006.01)
G11C 7/02 (2006.01)
G11C 16/08 (2006.01)

(52) U.S. Cl.
CPC ............ *H01L 27/0266* (2013.01); *G11C 7/02* (2013.01); *G11C 16/04* (2013.01); *G11C 16/0483* (2013.01); *G11C 16/16* (2013.01); *G11C 16/22* (2013.01); *G11C 16/08* (2013.01)

(58) Field of Classification Search
None
See application file for complete search history.

(56) References Cited

U.S. PATENT DOCUMENTS

| 4,916,333 | A | 4/1990 | Kowalski |
| 5,095,228 | A | 3/1992 | Galbraith et al. |
| 5,446,303 | A | 8/1995 | Quill et al. |
| 5,597,758 | A | 1/1997 | Heim et al. |
| 5,641,697 | A | 6/1997 | Iwanami |

(Continued)

OTHER PUBLICATIONS

Mikhalev, V., et al., A Novel Depletion Mode High Voltage Isolation Device, IEEE Xplore Digital Library, Microelectronics and ElectronDevices (WMED), 2010 IEEE Workshop, Apr. 16, 2010, pp. 1-3.

Primary Examiner — James G Norman
(74) Attorney, Agent, or Firm — Dicke, Billig & Czaja, PLLC

(57) ABSTRACT

Apparatus having an array of memory cells might include a first transistor having a control gate, a first source/drain connected to a first contact for connection to peripheral circuitry, and a second source/drain connected to a second contact for connection to a data line selectively connected to a respective set of strings of series-connected memory cells of the array of memory cells; and a second transistor having a control gate, a first source/drain connected to the second contact, and a second source/drain connected to a third contact for connection to a common source selectively connected to each string of series-connected memory cells of the respective set of strings of series-connected memory cells for the data line.

20 Claims, 15 Drawing Sheets

(56) References Cited

U.S. PATENT DOCUMENTS

| | | |
|---|---|---|
| 5,714,784 A | 2/1998 | Ker et al. |
| 6,121,643 A | 9/2000 | Gardner et al. |
| 6,163,058 A | 12/2000 | Williamson et al. |
| 6,292,391 B1 | 9/2001 | Nojima |
| 6,917,076 B2 | 7/2005 | Eguchi et al. |
| 7,078,286 B1 | 7/2006 | Mehta |
| 7,119,413 B2 | 10/2006 | Kutsukake et al. |
| 7,173,861 B2 | 2/2007 | Cho et al. |
| 7,230,299 B2 | 6/2007 | Robb et al. |
| 7,499,327 B2 | 3/2009 | Kwak et al. |
| 7,572,699 B2 | 8/2009 | Hong et al. |
| 8,766,365 B2 | 7/2014 | Smith |
| 2002/0056885 A1 | 5/2002 | Kita et al. |
| 2004/0057172 A1 | 3/2004 | Sun |
| 2005/0002141 A1 | 1/2005 | Reynders et al. |
| 2007/0063312 A1 | 3/2007 | Takemoto |
| 2008/0232009 A1 | 9/2008 | Ikegami |
| 2009/0194841 A1 | 8/2009 | Magome et al. |
| 2011/0063763 A1 | 3/2011 | Alvarez et al. |
| 2011/0127526 A1 | 6/2011 | Kawae et al. |
| 2011/0140227 A1 | 6/2011 | Smith et al. |
| 2011/0180867 A1 | 7/2011 | Tsang |
| 2012/0007193 A1 | 1/2012 | Lee et al. |
| 2012/0094458 A1 | 4/2012 | Cai |
| 2012/0182654 A1 | 7/2012 | Wang et al. |
| 2013/0214359 A1* | 8/2013 | Smith .................. H01L 27/0266 257/355 |

* cited by examiner

APPARATUS CONTAINING CIRCUIT-PROTECTION DEVICES

RELATED APPLICATIONS

This application is a Continuation of U.S. application Ser. No. 16/108,413, titled "CIRCUIT-PROTECTION DEVICES," filed Aug. 22, 2018, (pending) which is a Continuation of U.S. application Ser. No. 15/687,732, titled "CIRCUIT-PROTECTION DEVICES AND APPARATUS CONTAINING CIRCUIT-PROTECTION DEVICES," filed Aug. 28, 2017, issued as U.S. Pat. No. 10,163,893 on Dec. 25, 2018, which are commonly assigned and incorporated herein by reference.

FIELD

The present disclosure relates generally to circuit protection, and, in particular, the present disclosure relates to circuit-protection devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the memory cells, through programming (which is sometimes referred to as writing) of charge-storage structures (e.g., floating gates or charge traps) or other physical phenomena (e.g., phase change or polarization), determine the data state (e.g., data value) of each memory cell. Common uses for flash memory and other non-volatile memory may include personal computers, personal digital assistants (PDAs), digital cameras, digital media players, digital recorders, games, appliances, vehicles, wireless devices, mobile telephones, and removable memory modules, and the uses for non-volatile memory continue to expand.

In a NOR flash architecture, a column of memory cells are connected in parallel with each memory cell connected to a data line, such as a bit line. A "column" refers to a group of memory cells that are commonly connected (e.g., selectively connected) to a local data line, such as a local bit line. It does not require any particular orientation or linear relationship, but instead refers to the logical relationship between memory cell and data line.

Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. A source select gate for a NAND string is connected to a source, while a drain select gate for a NAND string is connected to a data line, such as column bit line.

Data lines are sometimes connected to circuitry (e.g., peripheral circuitry) that may be configured to handle relatively low voltages (e.g., that may be referred to as low-voltage circuitry), such as data cache circuitry. The low-voltage circuitry may provide relatively low voltages (e.g., 0 (zero) V up to about 4 V) to the data lines during read or write operations. Peripheral circuitry generally includes active circuitry for access of the array of memory cells that is formed outside of an active area or areas on which the array of memory cells is formed.

However, during erase operations (e.g., involving NAND memory arrays), memory cells may be erased a block at a time by grounding all of the access lines in the block, for example, while allowing the data lines to float. A relatively high erase voltage (e.g., about 20 to 30 V) may then applied to a semiconductor on which the memory cells are formed, and thus to the channels of the memory cells, to remove the charge from charge-storage structures. This can cause the data lines to float to about the erase voltage and can damage low-voltage peripheral circuitry connected to the data lines.

Therefore, circuit-protection devices, such as field-effect transistors (FETs), may be connected between the data lines and the low-voltage circuitry for protecting the low-voltage circuitry from the relatively high voltages that may be present on the data lines during an erase operation. The circuit-protection devices may be connected (e.g., selectively connected) on a one-to-one basis to the data lines or one circuit-protection device to two or more data lines through a multiplexer. However, the pitch of the circuit-protection devices may be relatively large in order to avoid breakdown of the circuit-protection devices. For example, the relatively large pitch may use up considerable area and thus may increase the size of the memory device.

DETAILED DESCRIPTION

Figure 1:
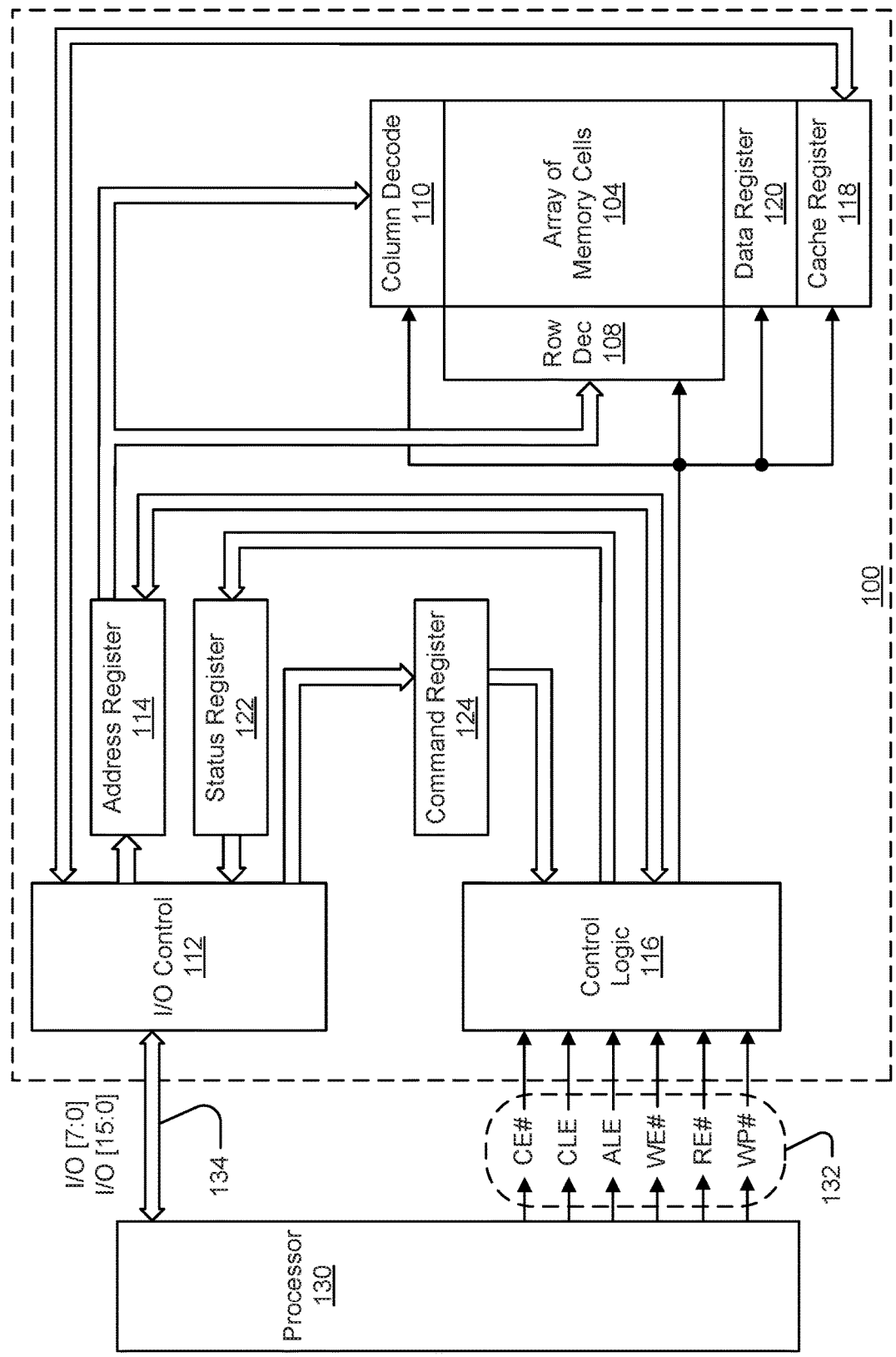
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones, removable memory modules and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller, such as an internal controller (e.g., control logic 116), controls access to the array of memory cells 104 in response to the commands and generates status information for the external processor 130, i.e., control logic 116 may be configured to perform access operations (e.g., read operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118 and data register 120. Cache register 118 latches data, either incoming or outgoing, as directed by control logic 116 to temporarily store data while the array of memory cells 104 is busy writing or reading, respectively, other data. During a programming operation (e.g., often referred to as a write operation), data is passed from the cache register 118 to the data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect W #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of I/O bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
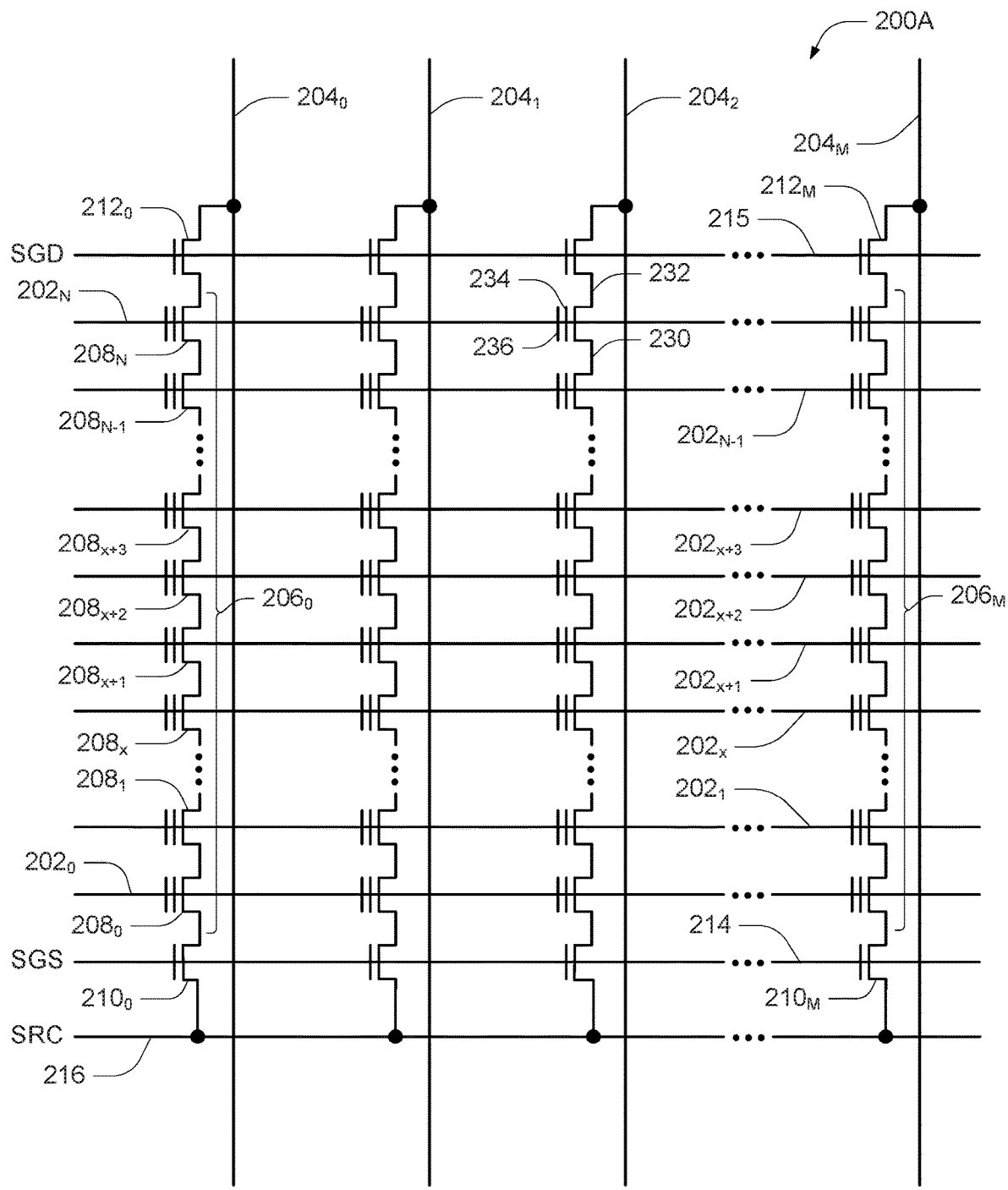
FIGS. 2A-2B are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. An array of memory cells, such as memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells, such as one of NAND strings $206_0$ to $206_M$. Each NAND string 206 might be connected (e.g., selectively connected) to a common source 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be commonly connected to a select line 215, such as a drain select line. Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to select line 215.

The array of memory cells in FIG. 2A might be a three-dimensional array of memory cells, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source 230 and a defined drain 232. Memory cells 208 have their control gates 236 connected to (and in some cases form) an access line, e.g., a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
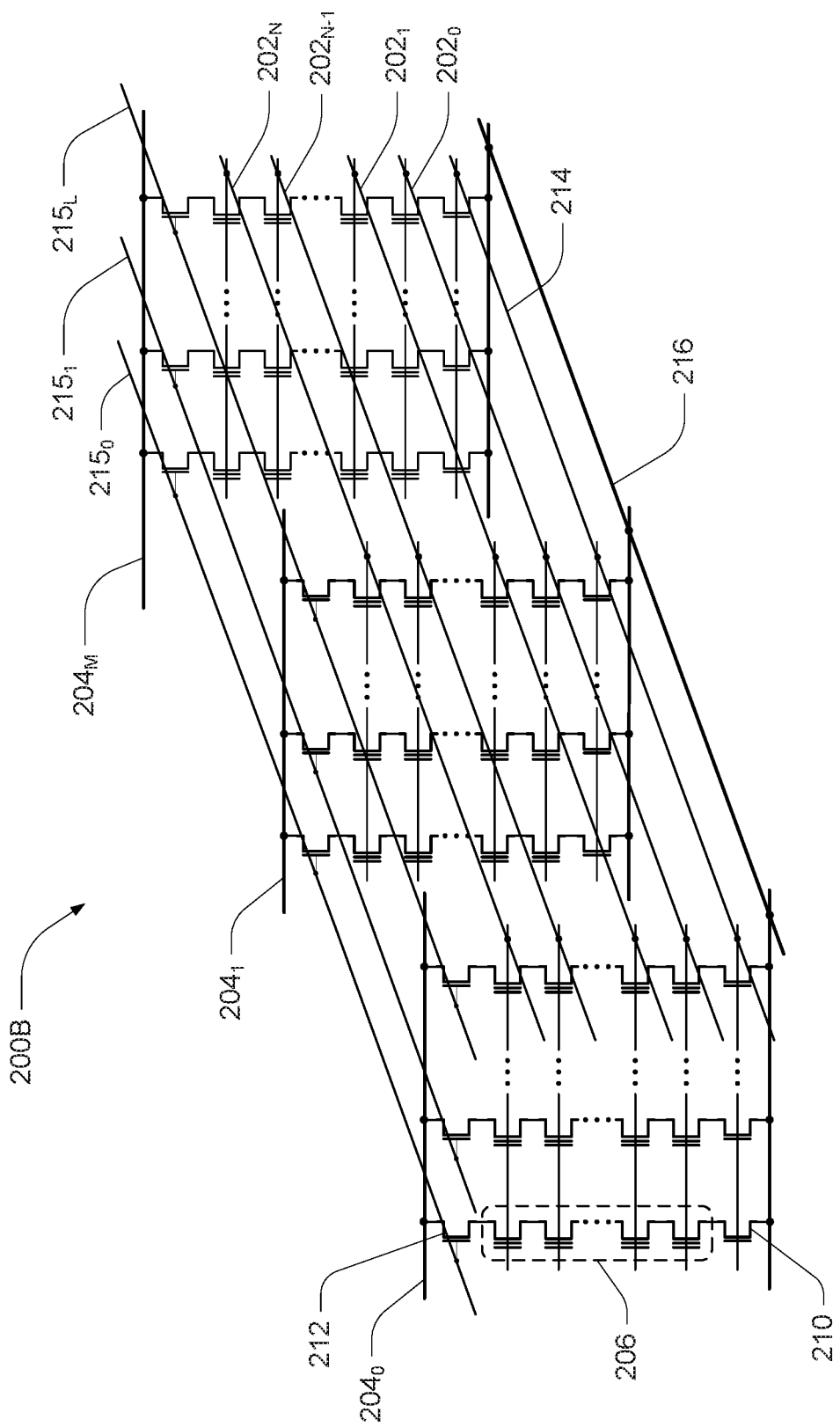

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional array of memory cells having a NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Although the examples of FIGS. 1 and 2 were discussed in conjunction with NAND flash, the embodiments described herein are not limited to NAND flash, but can include other memory architectures, such as NOR flash, etc.

Circuit-protection devices, such as field-effect transistors, may be connected (e.g., selectively connected) between the data lines (e.g., bit lines) and peripheral circuitry, which is often low-voltage circuitry, such as the low-voltage circuitry of data cache 118 and/or the low-voltage circuitry of data register 120, to protect the peripheral circuitry from the relatively high voltages that may be present on the bit lines during an erase operation or other high-voltage memory access operation within the array of memory cells. For example, a field-effect transistor may be deactivated (e.g., turned off) during a high-voltage memory access operation to protect the low-voltage circuitry from the relatively high voltages that may be present on the bit lines, and on during a read or write operation, or other low-voltage memory access operation, to pass the relatively low voltages between the low-voltage circuitry and the bit lines.

Each circuit-protection device may be formed on an active region that is separated and electrically isolated from an adjacent active region, on which an adjacent circuit-protection device is formed, by an isolation region, such as a shallow-trench isolation (STI) region. A bit line may be connected to a high-voltage side of a circuit-protection device, and the low-voltage circuitry may be connected to a low-voltage side of a circuit-protection device. For example, for a field-effect transistor, a contact (e.g., that may be referred to as a high-voltage-side contact) may couple a bit line to a source/drain region on the high-voltage side, and a contact (e.g., that may be referred to as a low-voltage-side contact) may couple low-voltage circuitry to a source/drain region on the low-voltage side. However, the pitch of the field-effect transistors may be relatively large, owing to the relatively large distance between the high-voltage-side contact and the edges of the active region on the high-voltage side that may be needed to avoid breakdown during an erase operation. Note that, as described herein, "high-voltage" and "low-voltage" refer only to relative values of voltage level, and do not require specific levels or polarities of voltage between the high-voltage and low-voltage sides of the circuit protection device, nor do they require a specific difference in voltage levels.

Figure 3:
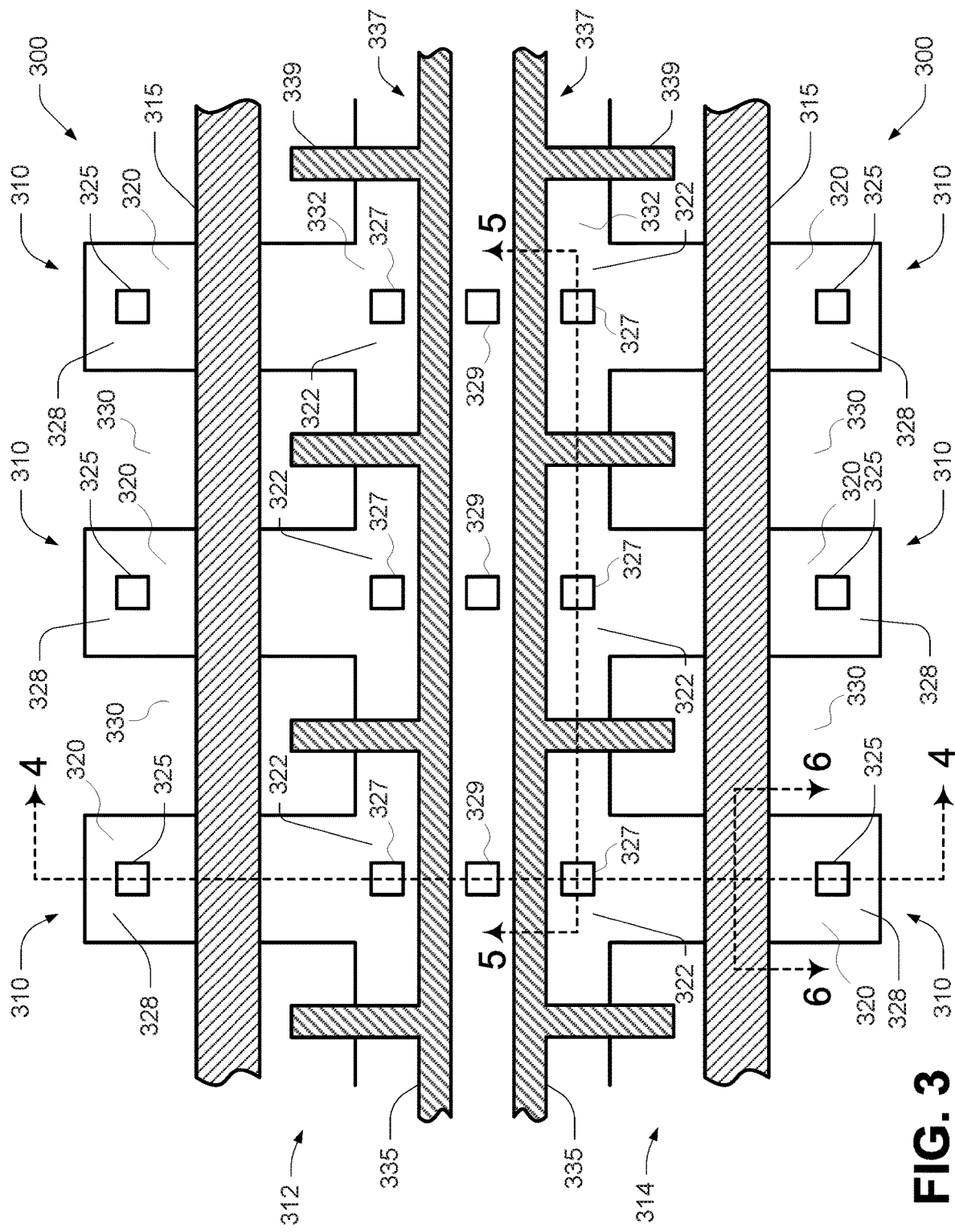
FIG. 3 is a top plan view of a circuit-protection device, according to another embodiment.

FIG. 3 is a top plan view of a circuit-protection device 300, e.g., that may also be referred to as a high-voltage isolation device. Circuit-protection device 300 may include a plurality of circuit-protection (e.g., high-voltage isolation) units 310. For example, circuit-protection device 300 may include a row 312 of circuit-protection units 310 and a row 314 of circuit-protection units 310. A row 312 of circuit-protection units 310 are those circuit-protection units 310 commonly coupled to a control line 315 and a row 314 of circuit-protection units 310 are those circuit-protection units 310 commonly coupled to another control line 315.

Each circuit-protection unit 310 may include a side (e.g., low-voltage side) that may include a node 320 (e.g., a low-voltage node) that may be connected to low-voltage circuitry, such as data cache 118 and/or data register 120 (FIG. 1). Each circuit-protection unit 310 may further include a side (e.g., high-voltage side, such as a bit-line side) that may include a node 322 (e.g., a high-voltage node) that may be connected to circuitry that can be at a relatively high voltage (e.g., about 20 to about 30 V) or a relatively low voltage (e.g., about zero (0) to about 4 V), such as a bit line 204 (FIG. 2). For example, a node 320 may include a contact 325 that may be connected (e.g., selectively connected) to low-voltage peripheral circuitry and a node 322 may include a contact 327 that may be connected (e.g., selectively connected) to a bit line. Each circuit-protection unit 310 may selectively connect a node 320 to a node 322.

Nodes 320 may be respectively formed in individual active regions 328 that are defined in a semiconductor by isolation regions 330, e.g., STI regions, formed in the semiconductor on either side of a given individual active region 328. In other words, an isolation region 330 is between adjacent active regions 328, respectively corresponding to adjacent nodes 320 of adjacent circuit-protection units 310 in each of rows 312 and 314. Each isolation region 330 electrically isolates and physically separates its adjacent active regions 328, and thus adjacent nodes 320, from each other. The semiconductor may be comprised of silicon, e.g., monocrystalline silicon, and, for example, may be conductively doped to have a conductivity type, e.g., a p-type conductivity, e.g., to form a p-well.

Nodes 322 of the circuit-protection units 310 of rows 312 and 314 are formed in a single (e.g., in a common) active region 332. That is, nodes 322 are not electrically isolated from or physically separated from each other by isolation regions formed in the semiconductor. Instead, nodes 322 of a row 312 or 314 may be selectively connected to each other by a gate 335 (e.g., that may be referred to as an isolation gate) formed over active region 332. Active regions 328 may be contiguous with active region 332. That is, active regions 328 may extend from active region 332, as shown in FIG. 3.

For example, when nodes 322 are at relatively high voltages (about 20 to 30 V), e.g., during an erase operation, gate 335 may be selectively allowed to float or a relatively high voltage may be selectively applied to gate 335 so that the nodes 322 are electrically connected. That is, gate 335 may be activated (e.g., turned on) to electrically connect nodes 322. Activating (e.g., turning on) the gate 335 may further electrically connect the nodes 322 to the contacts 329. During an erase operation, the bit lines, and thus the nodes 322 connected to the bit lines, may be at about the erase voltage concurrently and thus there is no need to electrically isolate nodes 322 from each other.

When nodes 322 are at relatively high voltages, circuit-protection units 310 may act to prevent the relatively high voltages from being passed to nodes 320 and thus to the low-voltage circuitry connected to nodes 320. In other words, when nodes 322 are at relatively high voltages, circuit-protection units 310 may electrically isolate nodes 322, and thus the bit lines, from nodes 320, and thus the low-voltage circuitry. For example, circuit-protection units 310 may be deactivated (e.g., turned off) to electrically isolate nodes 322 from nodes 320.

However, when nodes 322 are at relatively low voltages (about 0 (zero) to 4 V), e.g., during a read or write operation, gate 335 may be selectively grounded so that the nodes 322 are electrically isolated from each other. That is, gate 335 may be deactivated (e.g., turned off) to electrically isolate nodes 322. When nodes 322 are at relatively low voltages turning gate 335 off, e.g., by grounding gate 335, may provide sufficient isolation between nodes 322. This may avoid the need to form isolation (e.g., STI) regions in the semiconductor to create separate active regions with the isolation regions therebetween so that each active region includes one node 322. Forming isolation regions in the semiconductor to form separate active regions so that each active region includes one node 322 can increase the distance between adjacent nodes, and thus the pitch of circuit-protection units 310, as compared to when multiple nodes 322 are formed on a single active region with gate 335 between adjacent nodes.

For example, during a read or a write operation, a circuit-protection unit 310 may be activated (e.g., turned on) when the node 322 connected thereto is at a low voltage and when adjacent nodes 322 (e.g., vertically, horizontally, and/or diagonally in FIG. 3) are connected to circuit-protection units 310 that are deactivated (e.g., off). In such an example, deactivating (e.g., turning off) gate 335 acts to electrically isolate the node 322 connected to the circuit-protection unit 310 that is activated (e.g., on) from the adjacent nodes 322 connected to circuit-protection units 310 that are deactivated (e.g., off). As such, deactivating (e.g., turning off) gate 335 acts to electrically isolate adjacent nodes 322 that may be at different voltages. Deactivating (e.g., turning off) gate 335 may further electrically isolate the nodes 322 from the contacts 329. Note that portions of gate 335 may surround at least a portion of each node 322. That is, the portions of gate 335 may define nodes 322.

Figure 4:
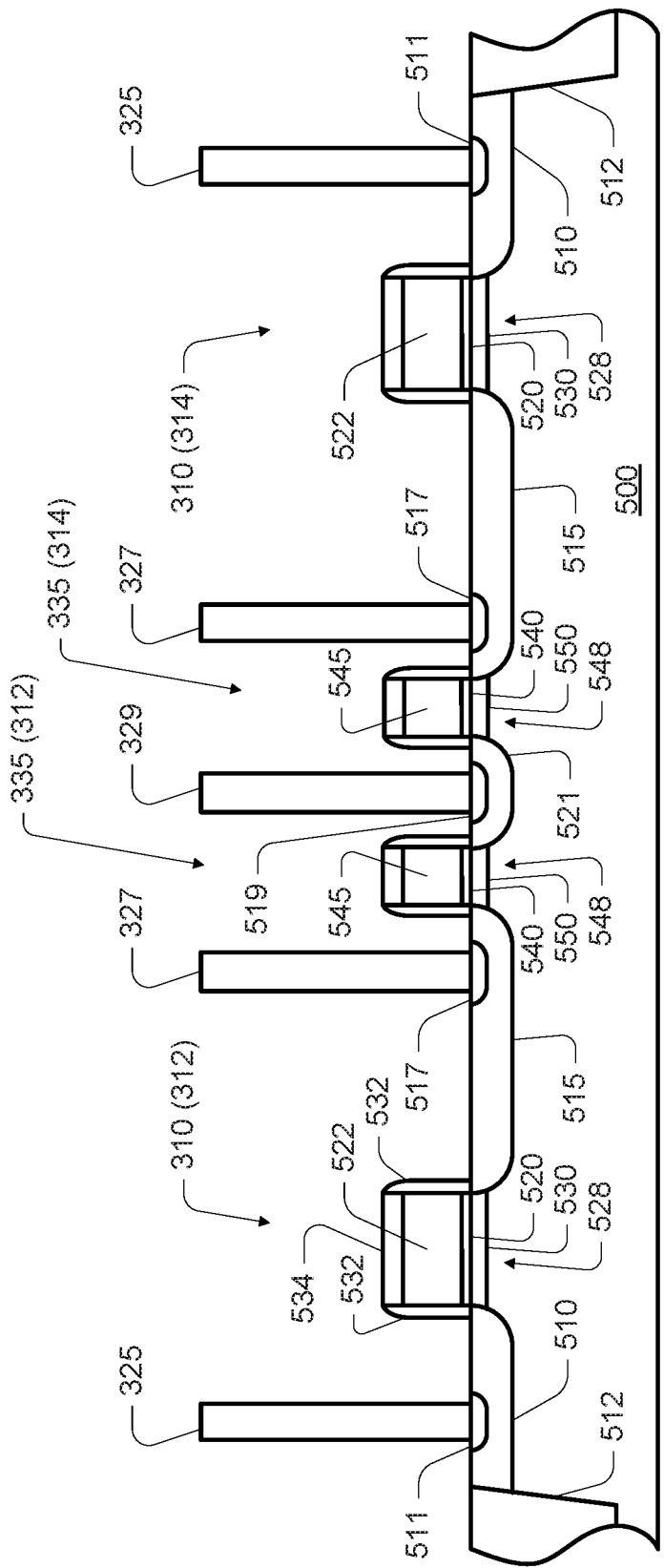
FIG. 4 illustrates a cross section taken along line 4-4 in FIG. 3.
Figure 5:
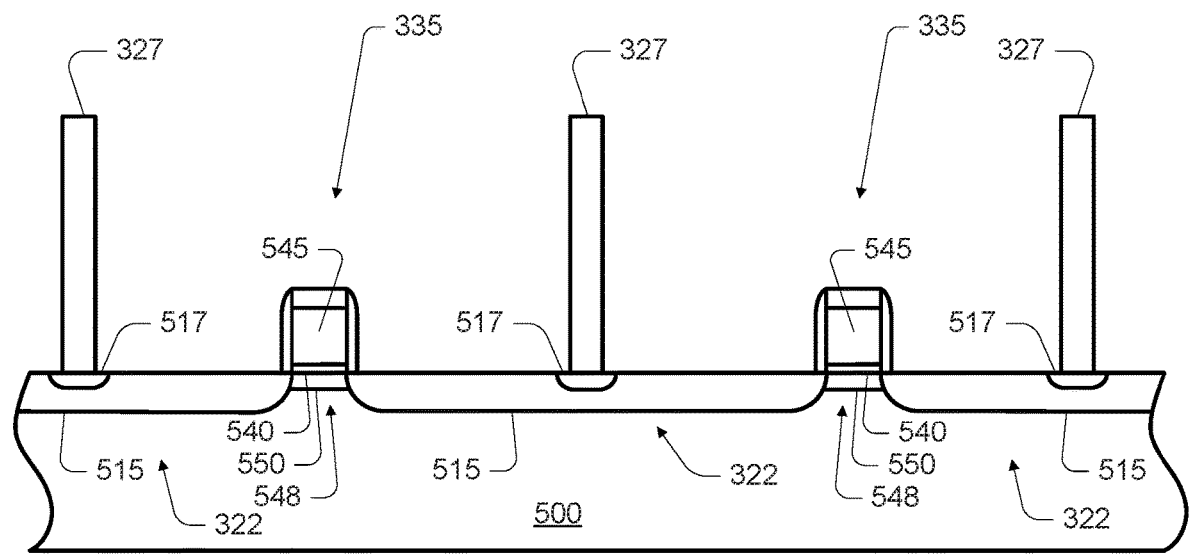
FIG. 5 illustrates a cross-section taken along line 5-5 in FIG. 3.
Figure 6:
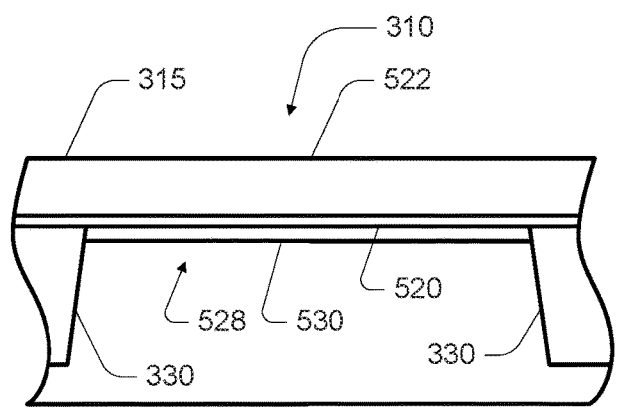
FIG. 6 illustrates a cross-section taken along line 6-6 of FIG. 3.

FIG. 4 illustrates a cross-section taken along line 4-4 in FIG. 3. FIG. 5 illustrates a cross-section taken along line 5-5 of FIG. 3. That is, FIG. 5 illustrates a portion of the high-voltage (e.g., bit-line) side of circuit-protection device 300, and thus a portion of the single active region 332, by spanning a plurality of nodes 322 and illustrating a gate (e.g., field-effect transistor) 335 between adjacent nodes 322. FIG. 6 illustrates a cross section taken along line 6-6 in FIG. 3, and thus illustrates the low-voltage side of a circuit-protection unit 310 and an active region 328. FIGS. 4-6 will now be discussed concurrently.

For some embodiments, each circuit-protection unit 310 may be a field-effect transistor 310, as shown in FIGS. 4 and 6. FIG. 4 illustrates a field-effect transistor 310 from row 312 and a field-effect transistor 310 from row 314, as indicated in parentheses in FIG. 4. Each field-effect transistor 310 may be formed over a semiconductor 500 that may be comprised of silicon, e.g., monocrystalline silicon, or other semiconductor material and, for example, may be conductively doped to have p-type conductivity, e.g., to form a p-well.

Each field-effect transistor 310 may include a source/drain 510 that corresponds to a node 320. Source/drains 510 may have a conductivity type different from (e.g., opposite of) the conductivity type of the semiconductor 500. For example, source/drains 510 may have an n-type conductivity, e.g., an n⁻ conductivity type, for some embodiments. A region 511 within (e.g., that forms a portion of) a source/drain 510 may have the conductivity type of the source/drain 510 at a different (e.g., higher) conductivity. For example, a region 511 may have an n-type conductivity, e.g., an n⁺ conductivity type, and may be connected to a contact 325. That is, regions 511 may be doped to a higher conductivity levels than source/drains 510. Source/drains 510 may be connected to low-voltage circuitry, such as data cache 118 and/or data register 120 through a contact 325.

Source/drains 510 may be adjacent to (e.g., may abut) isolation (e.g., STI) regions 512 in semiconductor 500. The isolation regions 512 may be formed of a dielectric material. The isolation regions 330 in FIGS. 3 and 6 may be contiguous with isolation regions 512. Note that the isolation regions 330 may define the active region 328 therebetween, as shown in FIG. 6.

The field-effect transistors 310 that form row 312 may have a source/drain 515 that is connected to (e.g., merges with) a source/drain region of a first gate 335 from row 312 that may be configured as a field-effect transistor 335. The field-effect transistors 310 that form row 314 may have a source/drain 515 that is connected to (e.g., merges with) a source/drain region of a second gate 335 from row 314 that may be configured as a field-effect transistor 335.

Source/drains 515 may have the conductivity type and level of the source/drains 510, e.g., an n⁻ conductivity type, for some embodiments. A region 517 within (e.g., that forms a portion of) a source/drain 515 may have the conductivity type and level of the regions 511, e.g., an n⁺ conductivity type, and may be connected to a contact 327, as shown in FIGS. 4 and 5. That is, regions 517 may be doped to a higher conductivity levels than source/drain 515. Therefore, source/drains 515 may be connected to bit lines 204 through contacts 327.

The field-effect transistors 310 may include a gate dielectric (e.g., a gate oxide) 520 over semiconductor 500 and a control gate 522 over gate dielectric 520, as shown in FIGS. 4 and 6. A control gate 522 may be connected to or form a portion of a control line 315 (FIGS. 3 and 6). A control gate 522, and thus a control line 315, may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material. As is common in semiconductor device fabrication, the field-effect transistors 310 may include dielectric sidewall spacers 532 and a dielectric cap 534.

A channel 528 of a field-effect transistor 310 may be between a source/drain 510 and a source/drain 515, as shown in FIG. 4. In other words, during operation of a field-effect transistor 310, a channel 528 can be formed.

A portion of channel 528 may have the conductivity type of the semiconductor 500 at a different (e.g., higher) conductivity. For example, a portion of channel 528 may be doped to have p-type conductivity, where the doped portion may be referred to as a threshold voltage (Vt) implant 530, as shown in FIGS. 4 and 6. For example, channel 528 may be lightly doped to have p-type conductivity so that the corresponding field-effect transistor 310 has a desired threshold voltage.

When a relatively high voltage is applied to a contact 327, and thus a source/drain 515, such as when array of memory cells 104 is erased, field-effect transistor 310 may be selectively deactivated (e.g., turned off) so as to protect (e.g., electrically isolate) the low-voltage circuitry connected to a contact 325, and thus a source/drain 510, from the relatively high voltage. In other words, field-effect transistor 310 can electrically isolate source/drain 510, and thus node 320, from source/drain 515, and thus node 322, when the relatively high voltage is applied to source/drain 515.

When a relatively low voltage is applied to a contact 327, and thus a source/drain 515, such as when array of memory cells 104 is being read or written to, field-effect transistor 310 may be selectively activated (e.g., turned on) so as to allow the relatively low voltage to be applied to the low-voltage circuitry connected to a contact 325, and thus a source/drain 510. In other words, field-effect transistor 310 can electrically connect source/drain 510, and thus node 320, to source/drain 515, and thus node 322, when the relatively low voltage is applied to source/drain 515. Note that field-effect transistor 310 may be said to selectively connect a node 320 to a node 322.

The field-effect transistors 335 may include a gate dielectric (e.g., a gate oxide) 540 over semiconductor 500 and a control gate 545 over gate dielectric 540, as shown in FIGS. 4 and 5. The gate dielectric 540 of the field-effect transistors 335 may be thinner than the gate dielectric 520 of the field-effect transistors 310. As an example, the gate dielectric 540 may have a thickness of about 68 Å while the gate dielectric 520 may have a thickness of about 400 Å. A control gate 545 may be connected to or form a portion of a control line 337 (FIG. 3). Control gate 545, and thus a control line 337, may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material. The control line 337, and thus field-effect transistors 335, may include spurs 339 extending between contacts 327. The spurs 339 may further extend over portions of the isolation regions 330. Although not shown in FIG. 3, the control lines 337 for both rows 312 and 314 may be electrically connected. In the same manner as discussed with respect to field-effect transistors 310, field-effect transistors 335 may also include dielectric spacers and cap.

The field-effect transistor 335 from row 312 may have a source/drain 521 that is connected to (e.g., merges with) a source/drain region of a field-effect transistor 335 from row 314. The source/drain 521 may have the conductivity type and level of the source/drains 510, e.g., an n⁻ conductivity type, for some embodiments. A region 519 within (e.g., that forms a portion of) the source/drain 521 may have the conductivity type and level of the regions 511 and 517, e.g., an n⁺ conductivity type, and may be connected to a contact 329, as shown in FIG. 4. That is, region 519 may be doped to a higher conductivity levels than source/drain 521. Source/drain 521 may be connected to a source (e.g., source 216 of FIGS. 2A-2B) through contact 329.

A channel 548 of a field-effect transistor 335 may be between a source/drain 515 and source/drain 521. In other words, during operation of a field-effect transistor 335, a channel 548 can be formed. A portion of channel 548 may have the conductivity type of the semiconductor 500 at a different (e.g., higher) conductivity. For example, a portion of channel 548 may be doped to have p-type conductivity, where the doped portion may be referred to as a threshold voltage (Vt) implant 550, as shown in FIGS. 4 and 5. For example, channel 548 may be lightly doped to have p-type conductivity so that the field-effect transistor 335 has a desired threshold voltage.

FIG. 5 shows that portions of field-effect transistors 335 are between nodes 322, and thus define nodes 322, on active region 332 on the high-voltage side of circuit-protection device 300. However, on the low-voltage side of circuit-protection device 300, isolation regions 330 formed in semiconductor 500 separate and electrically isolate individual active regions 328 from each other and thus define the individual active regions 328. Note that each active region 328 may include a source/drain 510 and a contact 325. Note that isolation regions 330 may extend into semiconductor 500 below an upper surface of substrate 500 and thus below upper surfaces of active regions 328, as shown in FIG. 6.

Nodes 322 of adjacent circuit-protection units 310 in a single row of circuit-protection units 310 may respectively correspond to the source/drains 515 of field-effect transistor 335. That is, one of the source/drains 515 of field-effect transistor 335 may correspond to a node 322 of a circuit-protection unit 310 and the other source/drain 515 of field-effect transistor 335 may correspond to a node 322 of an adjacent circuit-protection unit 310 in the same row of circuit-protection units 310, as shown in FIG. 5. Note that a row of circuit-protection units 310 are commonly connected to a control line 315, as shown in FIG. 3 for rows 312 and 314. Note further that a node 322 of a circuit-protection unit 310 may include a first source/drain of field-effect transistor 335 and a node 322 of an adjacent circuit-protection unit 310 in the same row (FIG. 5) or in a different row (FIG. 4) may include a second source/drain of field-effect transistor 335.

When source/drains 515 are at relatively high voltages, such as during an erase operation on array of memory cells 104, a voltage, sufficient to activate (e.g., turn on) field-effect transistor 335, may be selectively applied to control gate 545 of field-effect transistor 335, thereby electrically connecting nodes 322. Alternatively, control gate 545 may be selectively allowed to float so that the relatively high voltages on source/drains 515 can act to pull up field-effect transistor 335 to a voltage sufficient to activate (e.g., turn on) field-effect transistor 335, thereby electrically connecting nodes 322.

When a source/drain 515 is at relatively low voltage, such as during a write or read operation on an array of memory cells, control gate 545 of field-effect transistor 335 may be selectively grounded or otherwise biased so that field-effect transistor 335 is deactivated (e.g., turned off), thereby electrically isolating nodes 322 from each other. As such, field-effect transistor 335 may be said to selectively connect nodes 322 to each other. For example, adjacent nodes 322 on either side of field-effect transistor 335 (e.g., in the vertical, horizontal, and/or diagonal directions in frame of reference of FIG. 3) may be at different voltages during a write or read operation, and isolating these nodes 322 from each other using field-effect transistor 335 may act to prevent the voltage on one of the nodes from affecting the voltage on the other node.

FIGS. 7A-7H are top plan views of circuit-protection devices, according to embodiments. FIGS. 7A-7H depict various examples of termination options for the control lines 337 at the end of the active region 332.

Figure 7A:
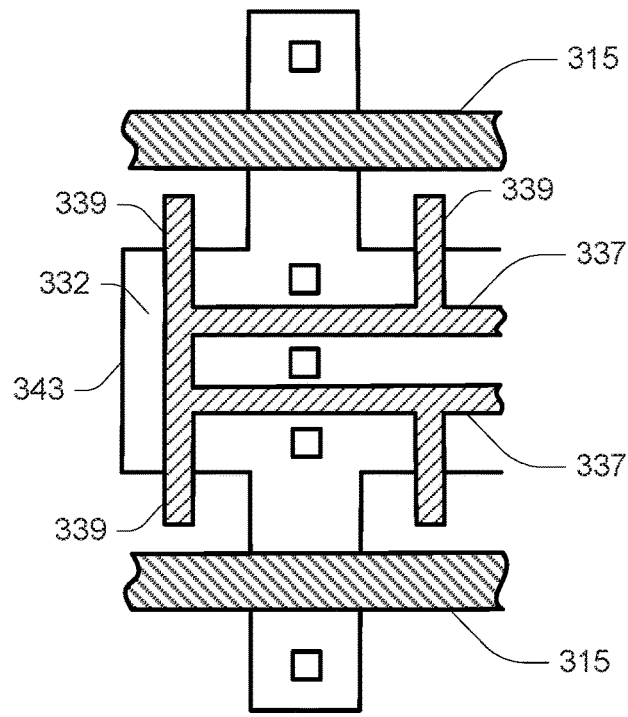
FIGS. 7A-7H are top plan views of circuit-protection devices, according to embodiments.
Figure 7B:
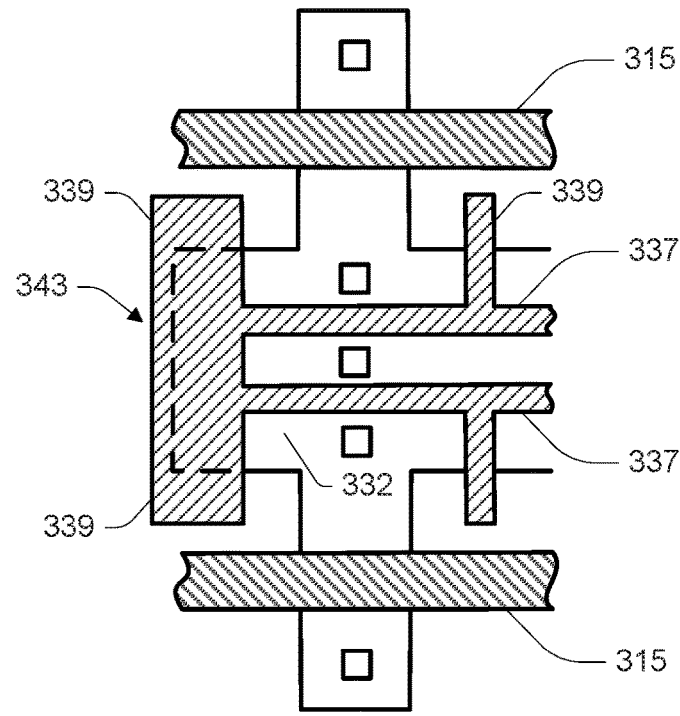

FIG. 7A depicts spurs 339 of control lines 337 at the end 343 of the active region 332 to be connected, with the control lines 337 terminating prior to the end 343 of the active region 332. The example of FIG. 7B is similar to the example of FIG. 7A, except that the spurs 339 of control lines 337 extend beyond the end 343 of the active region 332, such that the control lines 337 terminate beyond the end 343 of the active region 332. A thickness of the gate dielectric 540 formed under the spurs 339 at the end 343 of the active region 332 might be increased to mitigate breakdown voltage concerns.

Figure 7C:
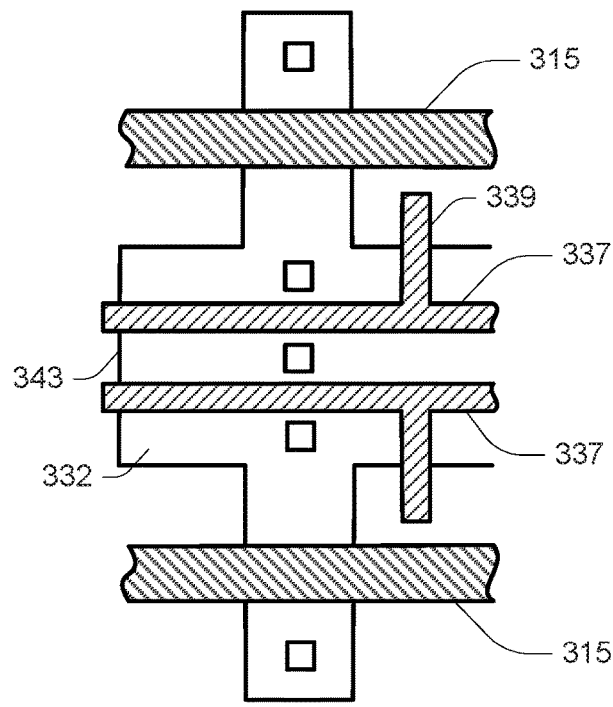
Figure 7D:
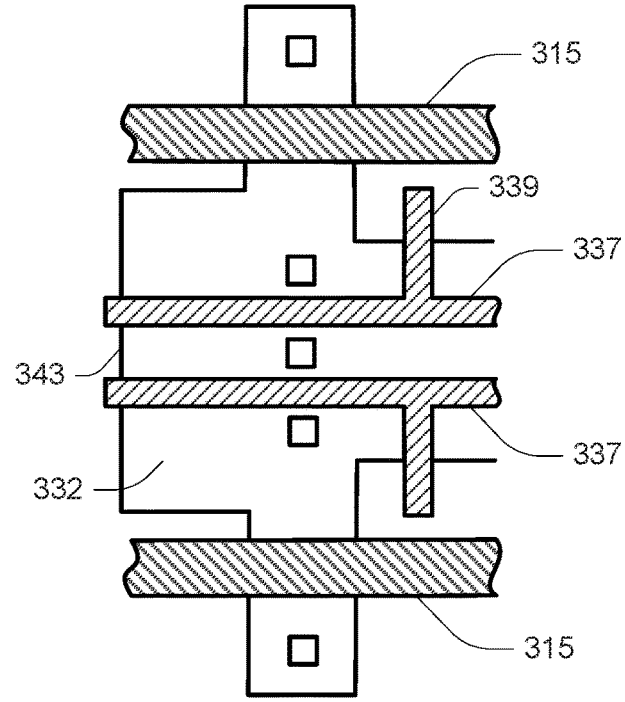
Figure 7E:
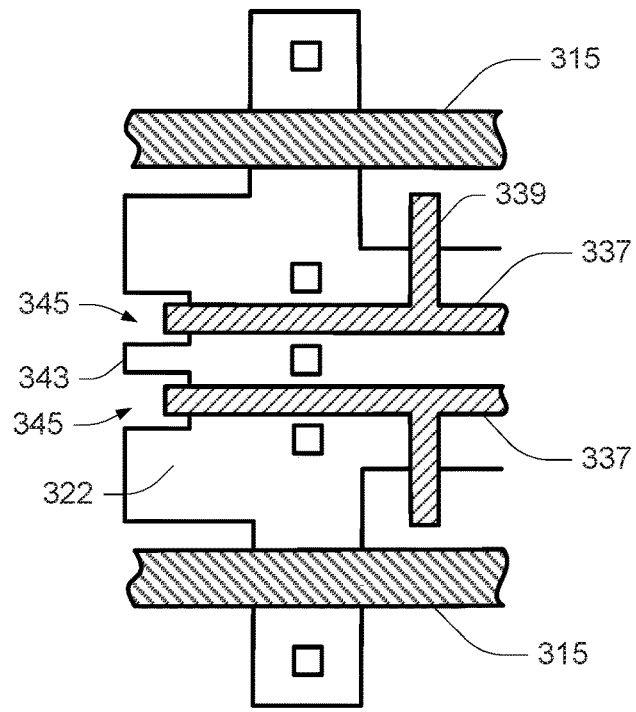

FIG. 7C depicts the control lines 337 terminating beyond the end 343 of the active region 332. While the control lines 337 are not depicted to be connected in FIG. 7C, they may be connected at some other point, an example of which may be found in FIG. 8. The example of FIG. 7D is similar to the example of FIG. 7C, except that the end 343 of the active region 332 is wider, i.e., extending closer to the control lines 315. The example of FIG. 7E is also similar to the example of FIG. 7C, except that the end 343 of the active region 332 includes notches 345 such that the control lines 337 terminate over an isolation region without extending beyond the end 343 of the active region 332.

Figure 7F:
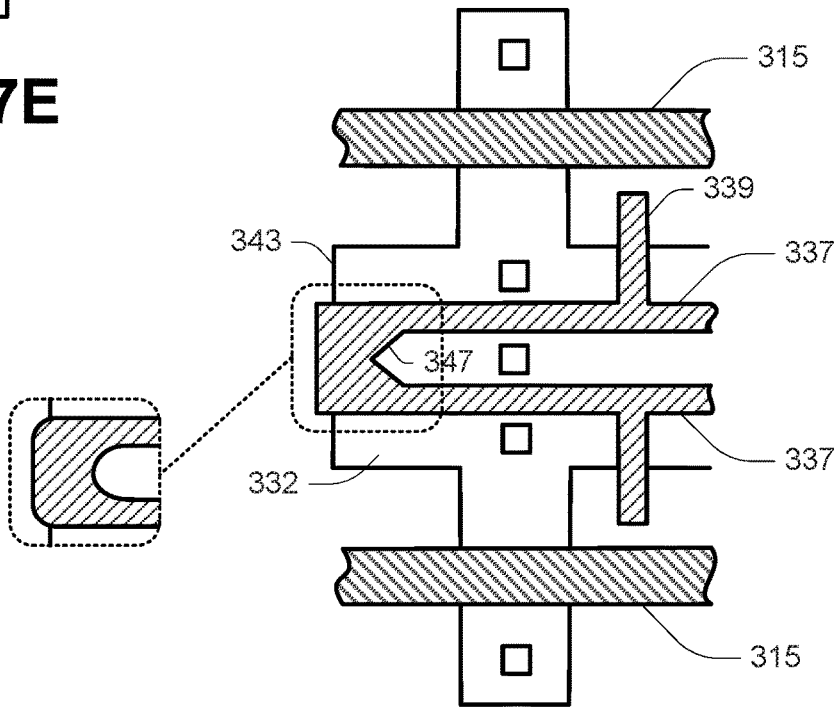

FIG. 7F depicts the control lines 337 being connected at the end 343 of the active region 332. The connection between the control lines 337 includes facets 347. Although described as facets 347, such features in fabrication generally become rounded, such as depicted in the offset image of FIG. 7F.

Figure 7G:
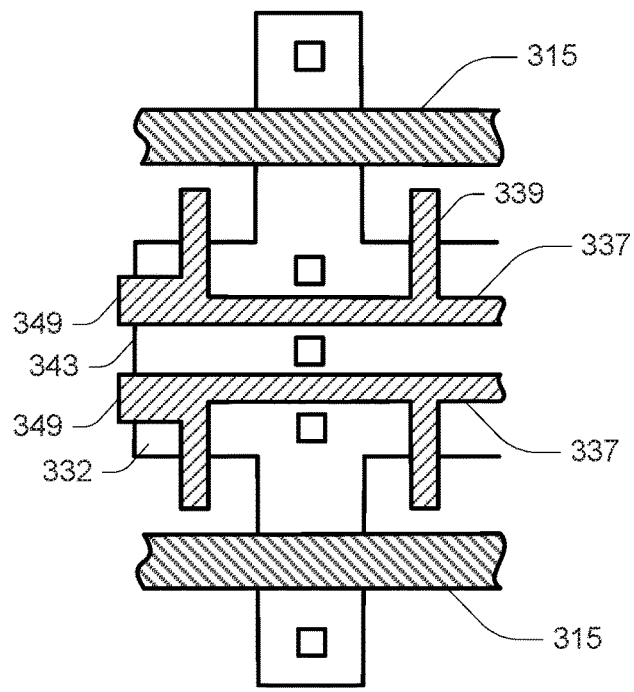
Figure 7H:
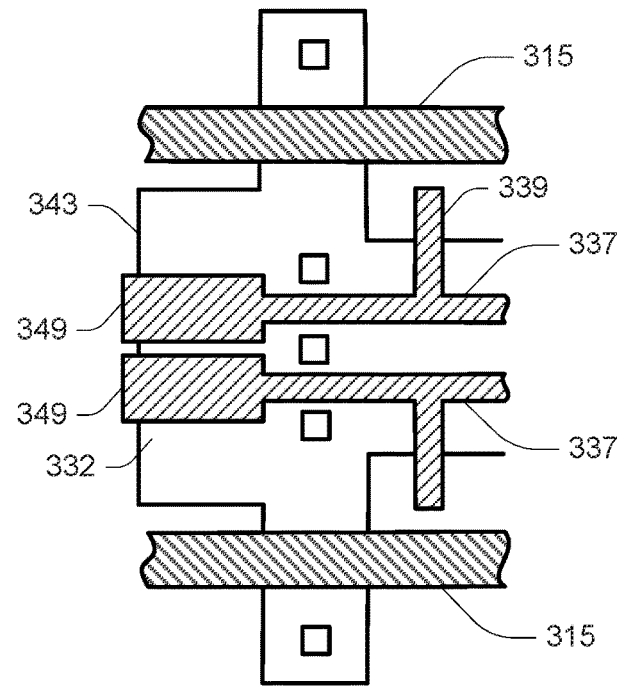

FIG. 7G depicts the control lines 337 terminating beyond the end 343 of the active region 332 and include widened portions 349, e.g., having an increased width compared to remaining portions of the control lines 337. The example of FIG. 7H is similar to the example of FIG. 7G, except that the widened portions 349 extend in both directions from a control line 337, e.g., toward a control line 315 and toward the other control line 337. A thickness of the gate dielectric 540 formed under the widened portions 349 at the end 343 of the active region 332 might be increased to mitigate breakdown voltage concerns. While the control lines 337 are not depicted to be connected in FIGS. 7G and 7H, they may be connected at some other point, an example of which may be found in FIG. 8.

Figure 8:
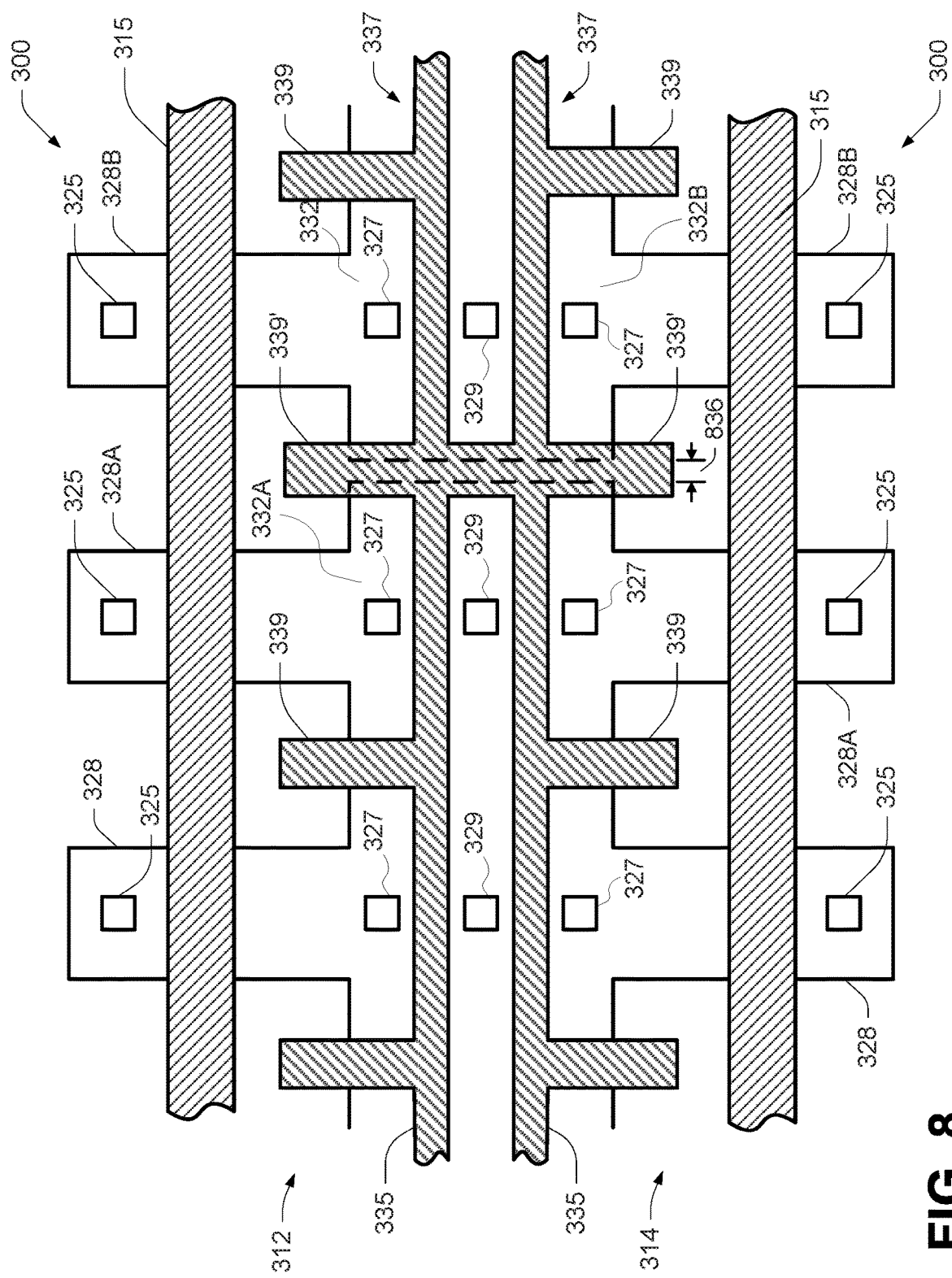
FIG. 8 is a top plan view of a circuit-protection device, according to another embodiment.

FIG. 8 is a top plan view of a circuit-protection device 300, according to another embodiment. The circuit-protection device 300 of FIG. 8 is similar to that depicted in FIG. 3, but varies in that an isolation region 836 is formed between active region 332A and active region 332B. The isolation region 836 might facilitate mitigation of plasma charging damage during fabrication that might be caused by a large continuous active region. While the spurs 339' extending over the isolation region 836 are depicted to have the same width as the other spurs 339, they may have a different (e.g., greater) width. For example, for at least a portion of the spurs 339' to extend over a portion of the active region 332A and over a portion of the active region 332B as well as over the isolation region 836, the spurs 339' might need to be wider than the spurs 339.

Figure 9:
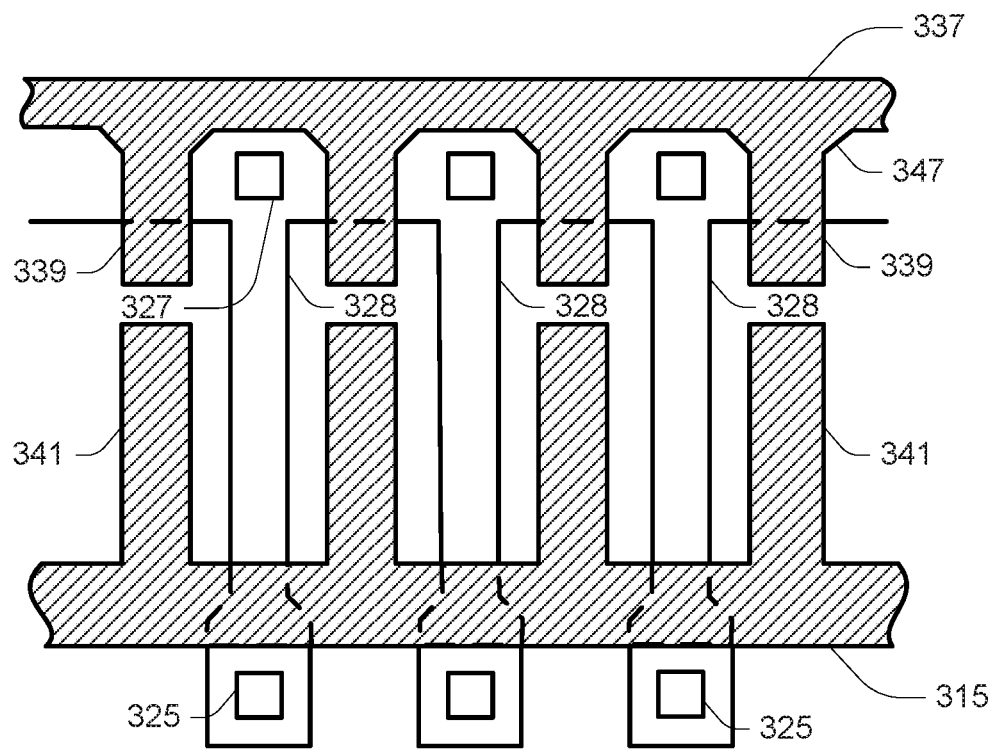
FIG. 9 is a top plan view of a circuit-protection device, according to another embodiment.

FIG. 9 is a top plan view of a circuit-protection device, according to another embodiment. In the embodiment depicted in FIG. 9, the control line 315 includes spurs 341 extending toward spurs 339 of the control line 337. Spurs 341 may facilitate improved current flow through the active region 328 between a contact 325 and a contact 327 during low-voltage operation. Control line 337 may further include facets 347 to round the corners of the control line 337. Although not depicted in other figures, facets 347 could be utilized to round inner corners of the spurs 339 of control lines 337 of other embodiments, as well as the spurs 341 of control line 315 of FIG. 9. In the example of FIG. 9, the active regions 328 are depicted to have a different (e.g., lesser) width in a portion between the contacts 325 and contacts 327 than at the end of the active region 328 connecting to the contact 325. The spurs 341 and narrowed active region 328 may facilitate the use of a thin gate dielectric in the control line 315, such as might be used in the control line 337, and may further facilitate the use of a narrowed gate length relative to prior embodiments.

Figure 10:
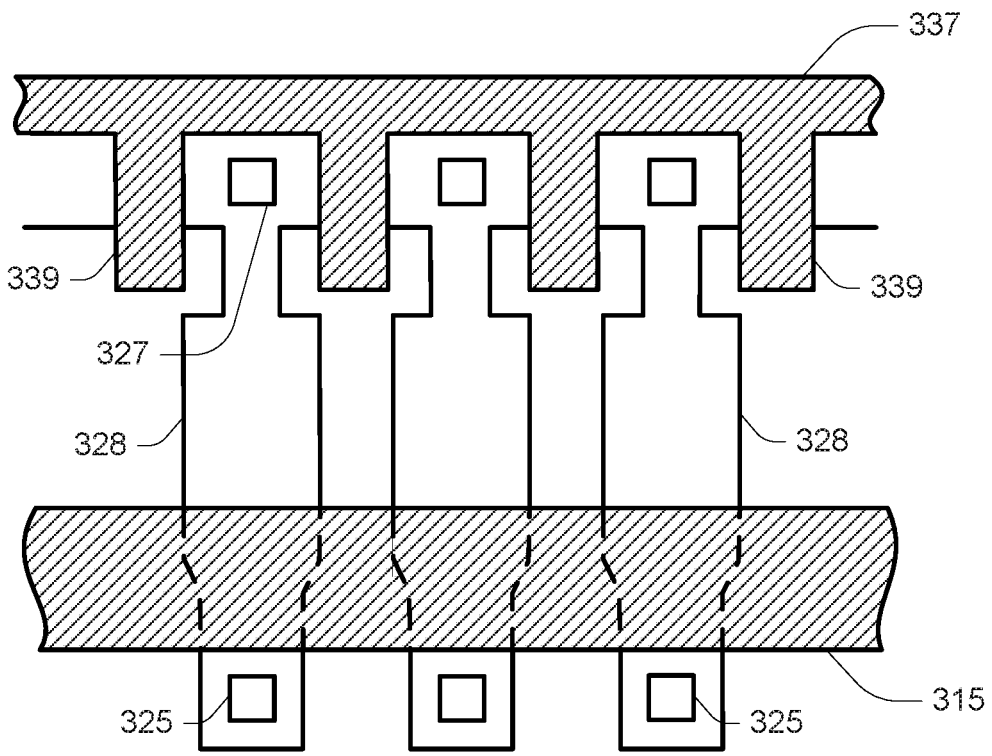
FIG. 10 is a top plan view of a circuit-protection device, according to another embodiment.

FIG. 10 is a top plan view of a circuit-protection device, according to another embodiment. In the embodiment depicted in FIG. 10, the active regions 328 are depicted to have a different (e.g., lesser) width in a portion between the contacts 325 and contacts 327 than at the end connecting to the contact 325, and are further depicted to have a different (e.g., greater) width in another portion between the contacts 325 and contacts 327 than at the end connecting to the contact 325. Varying the width of the active regions 328 between the contacts 325 and contacts 327 may facilitate adjustment of the breakdown voltage curve of the circuit-protection device.

Figure 11A:
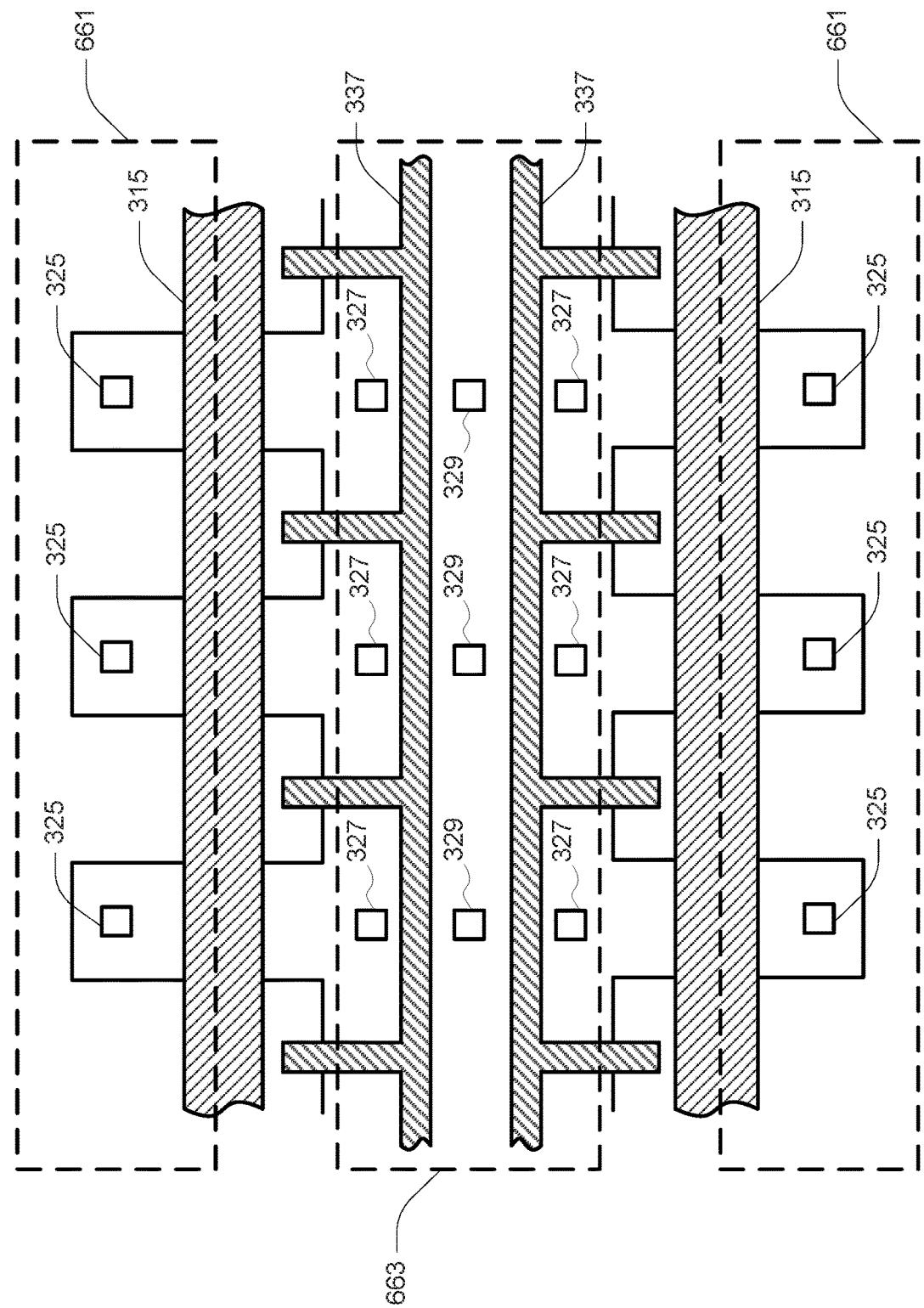
FIGS. 11A-11C are top plan views of circuit-protection devices, according to embodiments.
Figure 11B:
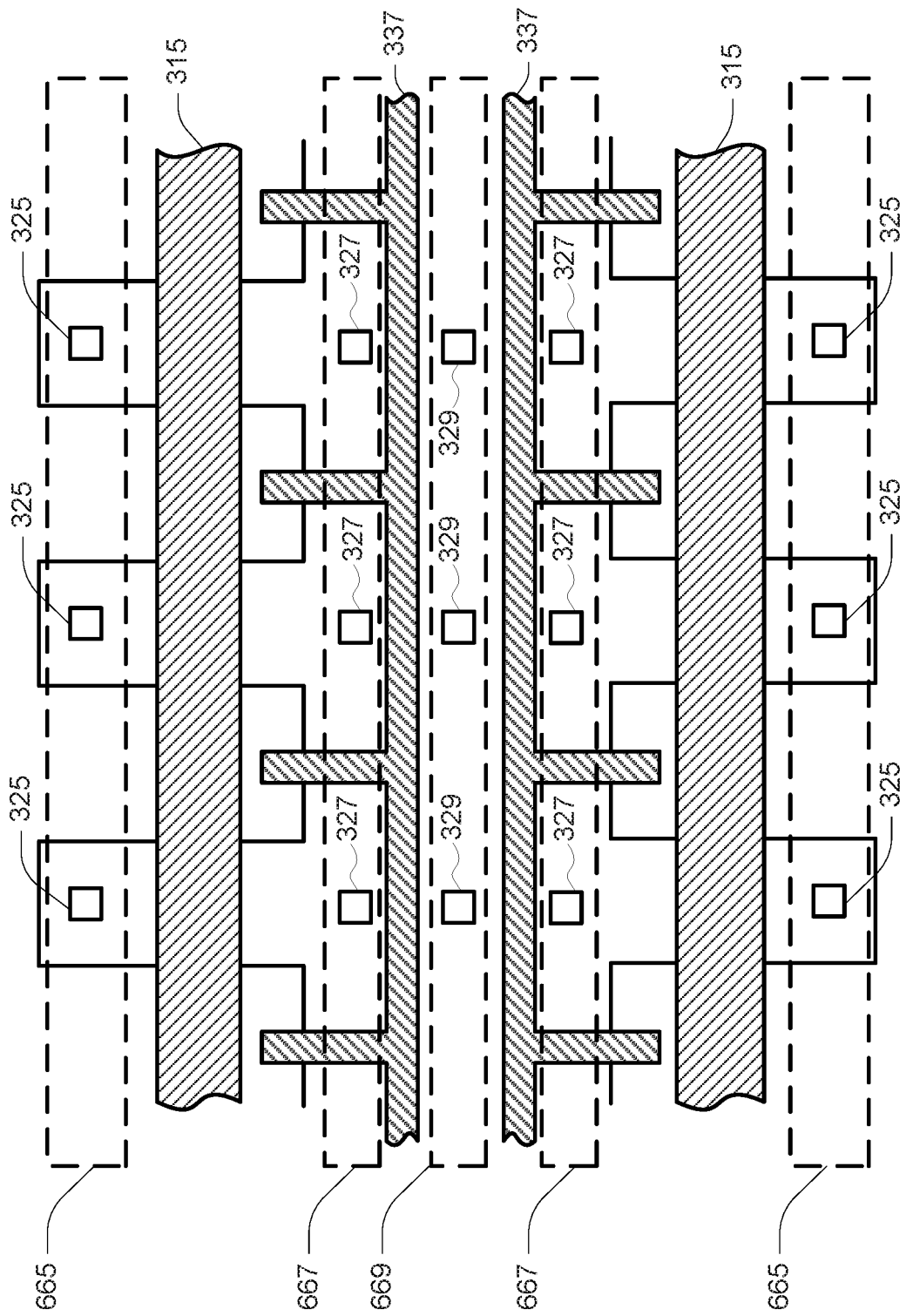
Figure 11C:
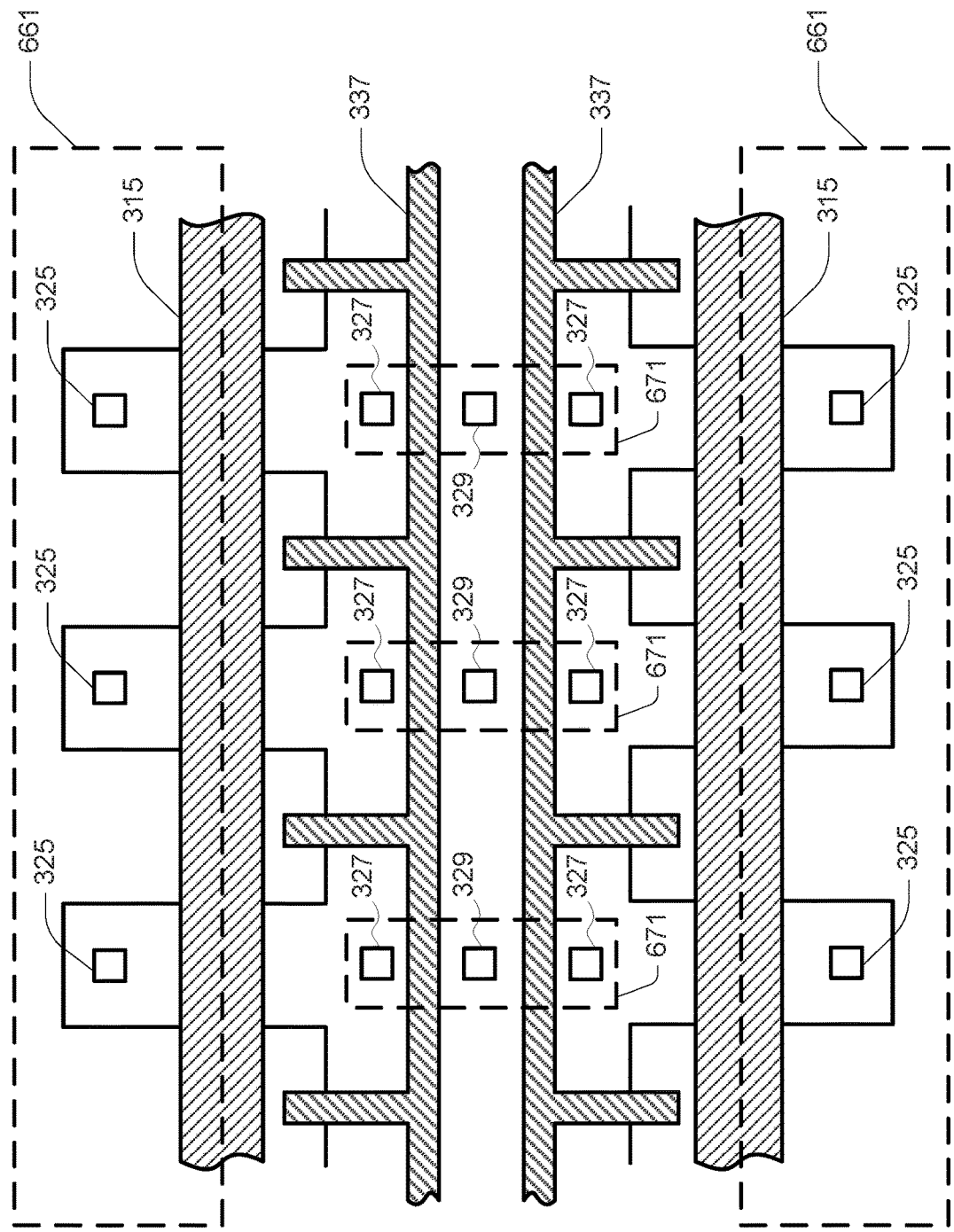

FIGS. 11A-11C are top plan views of circuit-protection devices, according to embodiments. FIGS. 11A-11C depict various examples of implant regions that might be used to improve conductivity to the contacts 325, 327 and 329, e.g., by forming regions 511, 517 and 519, respectively, as shown and discussed with reference to FIG. 4. Note that although contacts 325, 327 and 329 are depicted in FIGS. 11A-11C, they would generally not be formed until after forming the conductive regions 511, 517 and 519.

In FIG. 11A, an implant region 661 extends around each set of contacts 325, while another implant region 663 extends around both sets of contacts 327 and the contacts 329, e.g., around the areas in which those contacts would be formed. Note that implanting dopants, e.g., impurities suitable to impart conductivity, may only improve the conductivity of exposed portions of the active areas within and near the borders of the implant regions. The implant regions 661 extend beyond the exposed portions of the active regions 328 for connecting to the contacts 325.

In FIG. 11B, an implant region 665 extends around each set of contacts 325, an implant region 667 extends around each set of contacts 327, and an implant region 669 extends around the contacts 329, e.g., around the areas in which those contacts would be formed. The implant regions 665 differ from the implant regions 661 by not extending to the edges of the exposed portions of the active regions 328 for connecting to the contacts 325. Note that the embodiment depicted in FIG. 11B might also use an implant region 661 of FIG. 11A in place of an implant region 665.

In FIG. 11C, an implant region 661 extends around each set of contacts 325, while implant regions 671 each extend across both control lines 337 to extend around two of the contacts 327 and a contact 329, e.g., around the areas in which those contacts would be formed. Note that the embodiment depicted in FIG. 11C might also use an implant region 665 of FIG. 11B in place of an implant region 661.

CONCLUSION

Although specific embodiments have been illustrated and described herein, it will be appreciated by those of ordinary skill in the art that any arrangement that is calculated to achieve a similar (e.g., the same) purpose may be substituted for the specific embodiments shown. Accordingly, this application is intended to cover any adaptations or variations of the embodiments.

What is claimed is:
1. An apparatus, comprising:
an array of memory cells comprising a plurality of strings of series-connected memory cells;
a plurality of data lines, each data line of the plurality of data lines selectively connected to a respective set of strings of series-connected memory cells of the plurality of strings of series-connected memory cells;
peripheral circuitry for access of the array of memory cells;
a first transistor comprising a control gate, a first source/drain connected to a first contact for connection to the peripheral circuitry, and a second source/drain connected to a second contact for connection to a particular data line of the plurality of data lines; and a second transistor comprising a control gate, a first source/drain connected to the second contact, and a second source/drain connected to a third contact for connection to a common source selectively connected to each string of series-connected memory cells of the respective set of strings of series-connected memory cells for the particular data line.

2. The apparatus of claim 1, wherein the second source/drain of the first transistor is merged with the first source/drain of the second transistor.

3. The apparatus of claim 2, wherein the first source/drain of the first transistor abuts an isolation region.

4. The apparatus of claim 1, wherein a distance between the first contact and the second contact is greater than a distance between the second contact and the third contact.

5. The apparatus of claim 1, further comprising:
a third transistor comprising a control gate, a first source/drain connected to a fourth contact for connection to the peripheral circuitry, and a second source/drain connected to a fifth contact for connection to a different data line of the plurality of data lines; and
a fourth transistor comprising a control gate, a first source/drain connected to the fifth contact, and a second source/drain connected to the third contact;
wherein the common source is further selectively connected to each string of series-connected memory cells of the respective set of strings of series-connected memory cells for the different data line.

6. An apparatus, comprising:
an array of memory cells comprising a plurality of strings of series-connected memory cells;
a plurality of data lines, each data line of the plurality of data lines selectively connected to a respective set of strings of series-connected memory cells of the plurality of strings of series-connected memory cells;
peripheral circuitry for access of the array of memory cells;
a first transistor comprising a control gate connected to a first control line, a first source/drain connected to a first contact for connection to the peripheral circuitry, and a second source/drain connected to a second contact for connection to a first data line of the plurality of data lines;
a second transistor comprising a control gate connected to a second control line, a first source/drain connected to the second contact, and a second source/drain connected to a third contact for connection to a common source selectively connected to each string of series-connected memory cells of the respective set of strings of series-connected memory cells for the first data line;
a third transistor comprising a control gate connected to the first control line, a first source/drain connected to a fourth contact for connection to the peripheral circuitry, and a second source/drain connected to a fifth contact for connection to a second data line of the plurality of data lines;
a fourth transistor comprising a control gate connected to the second control line, a first source/drain connected to the fifth contact, and a second source/drain connected to a sixth contact for connection to the common source, wherein the common source is further selectively connected to each string of series-connected memory cells of the respective set of strings of series-connected memory cells for the second data line; and a fifth transistor comprising a control gate connected to the second control line, a first source/drain connected to the second contact, and a second source/drain connected to the fifth contact.

7. The apparatus of claim 6, wherein the first control line forms the control gates of the first transistor and the third transistor.

8. The apparatus of claim 7, wherein the second control line forms the control gates of the second transistor, the fourth transistor, and the fifth transistor.

9. The apparatus of claim 8, wherein the control gate of the fifth transistor is formed of a spur of the second control line extending between the second contact and the fifth contact, and wherein the spur of the second control line extends from a portion of the second control line extending between the second transistor and the fourth transistor.

10. The apparatus of claim 6, further comprising:
a sixth transistor comprising a control gate connected to a third control line, a first source/drain connected to a seventh contact for connection to the peripheral circuitry, and a second source/drain connected to an eighth contact for connection to a third data line of the plurality of data lines;
a seventh transistor comprising a control gate connected to a fourth control line, a first source/drain connected to the eighth contact, and a second source/drain connected to the third contact for connection to the common source, wherein the common source is further selectively connected to each string of series-connected memory cells of the respective set of strings of series-connected memory cells for the third data line;
an eighth transistor comprising a control gate connected to the third control line, a first source/drain connected to a ninth contact for connection to the peripheral circuitry, and a second source/drain connected to a tenth contact for connection to a fourth data line of the plurality of data lines;
a ninth transistor comprising a control gate connected to the fourth control line, a first source/drain connected to the tenth contact, and a second source/drain connected to the sixth contact for connection to the common source, wherein the common source is further selectively connected to each string of series-connected memory cells of the respective set of strings of series-connected memory cells for the fourth data line; and
a tenth transistor comprising a control gate connected to the fourth control line, a first source/drain connected to the eighth contact, and a second source/drain connected to the tenth contact.

11. The apparatus of claim 10, wherein the first contact, the second contact, the third contact, the seventh contact and the eighth contact are formed along a line extending from the first contact to the seventh contact, and wherein the fourth contact, the fifth contact, the sixth contact, the ninth contact and the tenth contact are formed along a line extending from the fourth contact to the ninth contact.

12. An apparatus, comprising:
an array of memory cells comprising a plurality of strings of series-connected memory cells;
a plurality of data lines, each data line of the plurality of data lines selectively connected to a respective set of strings of series-connected memory cells of the plurality of strings of series-connected memory cells;
peripheral circuitry for access of the array of memory cells;
a first circuit-protection unit having a first node formed in a first active region and a second node formed in a second active region contiguous with the first active region, wherein the first circuit-protection unit comprises:
  a first transistor comprising a control gate connected to a first control line, a first source/drain connected to a first contact for connection to the peripheral circuitry, and a second source/drain connected to a second contact for connection to a first data line of the plurality of data lines; and
  a second transistor comprising a control gate connected to a second control line, a first source/drain connected to the second contact, and a second source/drain connected to a third contact for connection to a common source selectively connected to each string of series-connected memory cells of the respective set of strings of series-connected memory cells for the first data line;
a second circuit-protection unit having a first node formed in the first active region and a second node formed in a third active region contiguous with the first active region and separated from the second active region by an isolation region, wherein the second circuit-protection unit comprises:
  a third transistor comprising a control gate connected to the first control line, a first source/drain connected to a fourth contact for connection to the peripheral circuitry, and a second source/drain connected to a fifth contact for connection to a second data line of the plurality of data lines; and
  a fourth transistor comprising a control gate connected to the second control line, a first source/drain connected to the fifth contact, and a second source/drain connected to a sixth contact for connection to the common source, wherein the common source is further selectively connected to each string of series-connected memory cells of the respective set of strings of series-connected memory cells for the second data line; and
  a fifth transistor comprising a control gate connected to the second control line, a first source/drain connected to the second contact, and a second source/drain connected to the fifth contact.

13. The apparatus of claim 12, wherein the second active region is rectangular, and wherein the third active region is rectangular.

14. The apparatus of claim 13, wherein an edge of the second active region in contact with the isolation region is parallel to an edge of the third active region in contact with the isolation region.

15. The apparatus of claim 12, wherein the control gate of the fifth transistor is formed from a spur of the second control line extending between the second contact and the fifth contact.

16. The apparatus of claim 15, wherein the spur extends over a portion of the isolation region.

17. The apparatus of claim 12, wherein a distance between the first control line and a portion of the first active region immediately adjacent the first circuit-protection unit is less than a distance between the first control line and a portion of the first active region immediately adjacent the second circuit-protection unit.

18. The apparatus of claim 17, wherein the portion of the first active region immediately adjacent the first circuit-protection unit is an end of the first active region.

19. The apparatus of claim 12, wherein the isolation region is a first isolation region, the apparatus further comprising:
  a third circuit-protection unit having a first node formed in the first active region and a second node formed in a fourth active region contiguous with the first active region, wherein the first circuit-protection unit comprises:
    a sixth transistor comprising a control gate connected to a third control line, a first source/drain connected to a seventh contact for connection to the peripheral circuitry, and a second source/drain connected to an eighth contact for connection to a third data line of the plurality of data lines; and
    a seventh transistor comprising a control gate connected to a fourth control line, a first source/drain connected to the eighth contact, and a second source/drain connected to the third contact for connection to the common source, wherein the common source is further selectively connected to each string of series-connected memory cells of the respective set of strings of series-connected memory cells for the third data line;
  a fourth circuit-protection unit having a first node formed in the first active region and a second node formed in a fifth active region contiguous with the first active region and separated from the fourth active region by a second isolation region, wherein the fourth circuit-protection unit comprises:
    an eighth transistor comprising a control gate connected to the third control line, a first source/drain connected to a ninth contact for connection to the peripheral circuitry, and a second source/drain connected to a tenth contact for connection to a fourth data line of the plurality of data lines; and
    a ninth transistor comprising a control gate connected to the fourth control line, a first source/drain connected to the tenth contact, and a second source/drain connected to the sixth contact for connection to the common source, wherein the common source is further selectively connected to each string of series-connected memory cells of the respective set of strings of series-connected memory cells for the fourth data line; and
  a tenth transistor comprising a control gate connected to the fourth control line, a first source/drain connected to the eighth contact, and a second source/drain connected to the tenth contact.

20. The apparatus of claim 12, wherein a distance between the first contact and the first transistor is less than a distance between the second contact and the first transistor, and wherein a distance between the first contact and the second contact is greater than a distance between the second contact and the third contact.

* * * * *